United States Patent
Osburn et al.

(10) Patent No.: US 7,102,338 B2
(45) Date of Patent: Sep. 5, 2006

(54) MULTI-SENSE VOLTAGE REGULATOR

(75) Inventors: Edward P. Osburn, Tigard, OR (US); Jeffrey A. Carlson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 100 days.

(21) Appl. No.: 10/692,552

(22) Filed: Oct. 23, 2003

(65) Prior Publication Data

US 2005/0088155 A1   Apr. 28, 2005

(51) Int. Cl.
G05F 1/44 (2006.01)
G05F 1/56 (2006.01)

(52) U.S. Cl. .................. 323/284; 323/285; 323/274

(58) Field of Classification Search ................ 323/284, 323/285, 274
See application file for complete search history.

(56) References Cited

U.S. PATENT DOCUMENTS

| | | | | |
|---|---|---|---|---|
| 6,005,303 A | * | 12/1999 | Hawkes et al. | 307/44 |
| 6,058,030 A | * | 5/2000 | Hawkes et al. | 363/65 |
| 6,262,566 B1 | * | 7/2001 | Dinh | 323/282 |
| 6,327,663 B1 | * | 12/2001 | Isaac et al. | 713/300 |
| 6,429,728 B1 | * | 8/2002 | Zabinski | 327/540 |
| 6,525,516 B1 | * | 2/2003 | Schultz et al. | 323/282 |
| 6,534,960 B1 | * | 3/2003 | Wells et al. | 323/222 |
| 6,594,556 B1 | * | 7/2003 | Agatstein et al. | 700/298 |
| 6,642,631 B1 | * | 11/2003 | Clavette | 307/52 |
| RE38,371 E | * | 12/2003 | Dinh | 323/282 |
| 6,664,774 B1 | * | 12/2003 | Lethellier | 323/282 |
| 6,696,822 B1 | * | 2/2004 | Takabayashi | 323/224 |
| 6,791,390 B1 | * | 9/2004 | Gay | 327/332 |
| 6,879,489 B1 | * | 4/2005 | Koertzen | 361/704 |

* cited by examiner

Primary Examiner—Bao Q. Vu
(74) Attorney, Agent, or Firm—Robert A. Diehl

(57) ABSTRACT

A voltage regulator has an output path to couple to a load. A first sense point at a first sense location on the output path is to sense a first feedback signal for the voltage regulator. And, a second sense point at a second sense location on the output path is to sense a second feedback signal for the voltage regulator.

30 Claims, 6 Drawing Sheets

MULTI-SENSE VOLTAGE REGULATOR

FIELD OF THE INVENTION

The present invention relates to the field of voltage regulation. More specifically, the present invention relates to a multi-sense voltage regulator.

BACKGROUND

An integrated circuit (IC) may include millions of circuit elements that can be on or off at any instant in time. The voltage level in the IC tends to rise or fall according to the load (the number of active elements on or off) at any given time. Moreover, when a large number of elements transition between on or off at the same instant, the voltage level can change dramatically at that instant in time. This dramatic voltage change is often called a transient change because the voltage level droops downward or spikes upward momentarily and then eventually settles to a steady-state value.

In order for a circuit element to transition between on and off, the element is likely to require a certain minimum voltage level. In other words, if the voltage level drops too low, the circuit element may not reliably transition, which can cause unacceptable errors. One approach to this problem, at least for steady-state voltage changes, is a guard voltage.

A guard voltage guards against the voltage level dropping too low. That is, the source voltage is set high enough so that the voltage level remains higher than the minimum voltage needed even during times of heavy load. The trade-offs, however, for a guard voltage are power consumption and heat generation. Millions of circuit elements in an IC can consume a great deal of power and generate a great deal of heat. The power consumed, and the heat generated, are often directly related to the voltage level at which the elements operate. A guard voltage that is high enough to guard against heavy loads is likely to be much too high to be practical in terms of power consumption and heat generation in many modern ICs.

Furthermore, transient voltage changes may simply be too big to guard against. One approach for dealing with transient changes is to require a settling time following a transition. That is, transitions can be scheduled far enough apart in time so that the voltage level has time to settle to a steady state between transitions. Of course, the trade-off for a transient settling time is speed, potentially limiting the clock rate or operating frequency of an IC.

Another approach to dealing with changes in voltage levels is a voltage regulator. A voltage regulator can adjust a source voltage to try to compensate for changes detected in the voltage level at a load. There is virtually always some delay and inaccuracy involved, so a voltage regulator is often used in combination with a guard voltage and a settling time. Depending on the accuracy and responsiveness of a particular voltage regulator, the guard voltage and settling time may be larger or smaller. In other words, a better voltage regulator can support smaller guard voltages and smaller settling times, and, consequently, a better voltage regulator can provide faster, cooler, and more power-efficient ICs.

BRIEF DESCRIPTION OF DRAWINGS

Examples of the present invention are illustrated in the accompanying drawings. The accompanying drawings, however, do not limit the scope of the present invention. Similar references in the drawings indicate similar elements.

DETAILED DESCRIPTION OF THE INVENTION

In the following description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternative embodiments. In other instances, well known methods, procedures, components, and circuits have not been described in detail. Parts of the description will be presented using terminology commonly employed by those skilled in the art to convey the substance of their work to others skilled in the art. Repeated usage of the phrase "in one embodiment" does not necessarily refer to the same embodiment, although it may.

Embodiments of the present invention provide a voltage regulator that uses multiple sense locations in an output path between a voltage source and a load. Using multiple sense locations, embodiments of the present invention can provide improved accuracy and/or responsiveness compared to many single-sense voltage regulators. Certain embodiments of the present invention use two sense locations, one for sensing transient voltage changes at or near a load, and another sense location or point for sensing steady-state changes in the same output path, but at a platform or board level. As described below, by sensing transient changes at a load, embodiments of the present invention can support a variety of loads using a single platform, while still providing improved voltage regulator performance.

Figure 1:
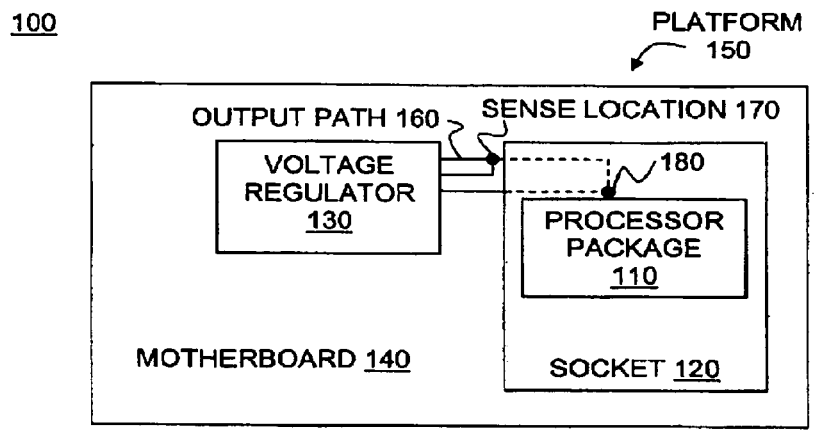
FIGS. 1 and 2 illustrate one embodiment of a system in which the present invention can be used.
Figure 2:
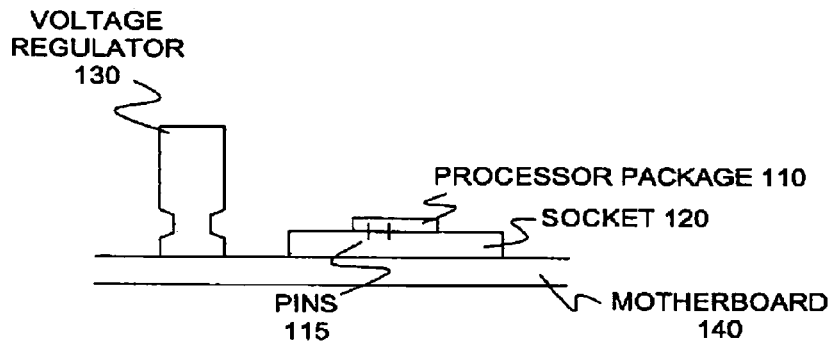

FIGS. 1 and 2 illustrate a system 100 in which embodiments of the present invention can be used. The load in system 100 is a processor package 110. Processor package 110 is supported by a platform 150 that includes a socket 120, a voltage regulator 130, and a motherboard 140. Processor package 110 includes a number of pins 115 that insert into socket 120. Socket 120 provides electrical connections between processor package 110 and motherboard 140.

Voltage regulator 130 is also electrically connected to motherboard 140. Voltage regulator 130 regulates a source voltage and provides the source voltage to processor package 110 through an output path 160 in motherboard 140 and socket 120. Voltage regulator 130 also receives feedback voltages from sense locations 170 and 180 along output path 160, and uses the feedback voltages to regulate the source voltage.

In one embodiment, platform 150 can support a variety of loads. For instance, by employing a uniform pin configuration, a variety of processor packages can be installed in socket 120. This technique is often used in the electronics industry because a product line may, for example, include a number of processors, each providing different levels of performance at different price points. Developing and manufacturing one platform to support all, or several, of the processors can provide significant cost savings compared to developing a separate platform for each processor.

In order to regulate the voltage level at a processor package, the ideal location to sense the voltage level is usually at the processor package. This is because the farther away a sense location is from the load, the less accurate and responsive the voltage regulator is.

To use an analogy, the voltage regulator is like a dam. The load is like a mill down stream from the dam. The water level is like the voltage level. And, the water current is like electrical current. The dam can be opened and closed to regulate the water level down stream at the mill. The mill can use more or less water current at any instant in time, increasing or decreasing the water level at the mill. As the water level at the mill changes, the change is eventually propagated upstream to the dam. So, any number of locations can be monitored to get an indication of the water level at the mill. But, the best place to monitor the water level, and get the fastest response to a change, is where the change originates, i.e. at the mill where the water is used.

Many processor packages include sense pins, such as pins 115 in FIG. 2. The sense pins can be used to measure the voltage level at the processor in the processor package. Unfortunately, different processors are likely to have different electrical characteristics, potentially receiving a different steady-state voltage level for each processor when the same source voltage is supplied by the platform. A voltage regulator that can handle multiple steady-state feedback voltages, or using different voltage regulators for each different processor, could add a great deal of cost and complexity to a platform. So, a more cost-effective approach may be to use one, less complicated voltage regulator, and take the steady-state feedback voltage from a point where it is largely unaffected by the different processor characteristics. Such a point is often at the platform level. For instance, in FIG. 1, sense location 170, on motherboard 140, may be used to take a steady-state feedback voltage.

Of course, taking the feedback voltage at the platform level can be relatively far removed from the actual voltage level sought to be regulated, i.e. the voltage level at the processor. This feedback may provide an accurate indication of the voltage level at the processor, but only after a change in the voltage level has had time to propagate out to the sense location.

In which case, embodiments of the present invention include at least one additional sense location, such as sense location 180 in FIG. 1, using, for instance, sense pins 115 in FIG. 2. Rather than using the steady-state response however, embodiments of the present invention can use the transient response from this additional sense location. The transient response may be short lived, and it may not give an accurate indication of where the voltage level will eventually settle, but it can give an almost instantaneous indication of a change in the voltage level and a direction of that change.

Using the combined feedback voltages from multiple sense locations, embodiments of the present invention can respond quickly based on the transient feedback and accurately based on the steady-state feedback. Moreover, the particular electrical characteristics of a given processor are largely irrelevant to the transient response so that embodiments of the present invention can support a variety of loads using a single platform, and a comparatively simple voltage regulator, while providing improved responsiveness and/or accuracy compared to a single-sense location voltage regulator.

Embodiments of the present invention can be used in a number of applications. For example, system 100 can represent a wide variety of electrical systems such as computers, cell phones, personal data assistances, and the like. In alternate embodiments, the load could be any of a number of electrical components, devices, or chips that can benefit from voltage regulation. Similarly, platform 150 could include any of a number of additional components, such as memory chips, data and address buses, input/output ports, etc.

Figure 3:
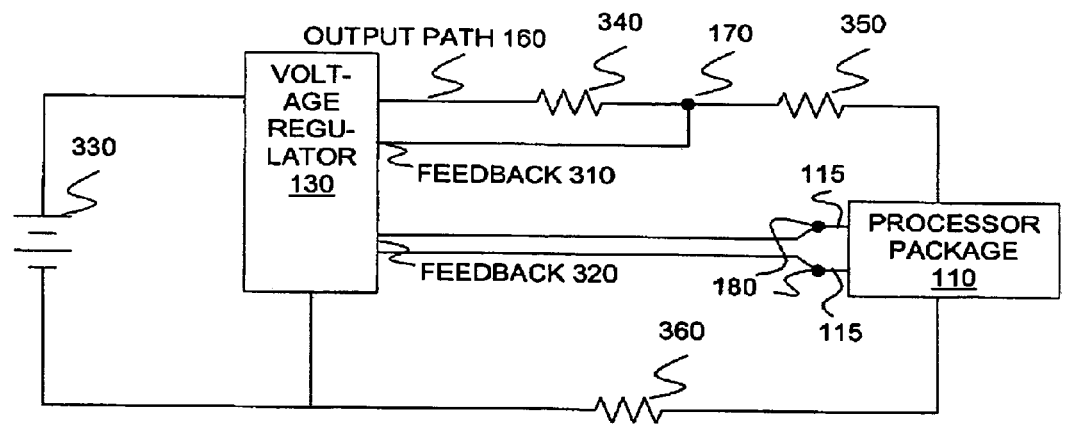
FIG. 3 illustrates a system-level schematic of one embodiment of the present invention.

FIG. 3 illustrates one embodiment of a circuit schematic of system 100 from FIGS. 1 and 2. A voltage source 330 provides the source voltage to processor package 110. The output path 160 between voltage source 330 and processor package 110 passes through voltage regulator 130. Voltage regulator 130 includes two feedback inputs 310 and 320 from different locations on output path 160. The first input comes from sense location 170 on the motherboard. Resistor 340 represents the parasitic resistance in the power path and pins along output path 160 from voltage regulator 130 through motherboard 140 to sense location 170. The second input comes from sense location 180 at sense pins 115 on processor package 110. Resistor 350 represents the parasitic resistance in the power path and pins along output path 160 from motherboard 140 through socket 120 to sense pins 115. As discussed above, embodiments of the present invention can use sense location 170 for steady-state feedback, and sense location 180 for transient feedback, and combine the feedbacks to regulate the source voltage.

Certain embodiments may use a single sense pin at the processor. In which case, the voltage level would likely be measured with respect to a source ground for the entire system. However, the system is likely to include some parasitic resistance between the ground pin of the processor and the source ground for the system. This parasitic resistance is represented by resistor 360. In order to get a more accurate measure of the voltage change across the processor, the illustrated embodiment uses two sense pins 115. One sense pin provides the source voltage level going into the processor and the other sense pin provides the voltage level at the processor's ground. In which case, feedback 320 comprises a differential pair, and the voltage level can be measured as the difference between the two lines.

Figure 4:
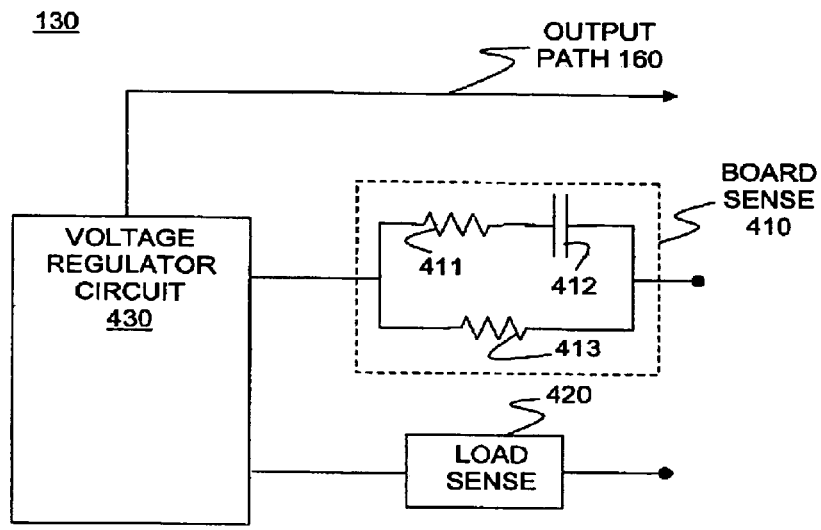
FIG. 4 illustrates one embodiment of a voltage regulator.

FIG. 4 illustrates one embodiment of a voltage regulator 130 that can be used in system 100 of FIGS. 1 and 2. Voltage regulator 130 includes two input circuits 410 and 420, and a regulator circuit 430. Input circuit 410 can receive the feedback voltage from the sense location on the motherboard. This board-sense circuit 410 can filter the feedback to remove transients. Any number of transient filter circuits can be used. In the illustrated embodiment, circuit 410 comprises a resistor 411 in series with a capacitor 412, both in parallel with a resistor 413.

Input circuit 420 can receive the feedback voltage from the sense location on the load. This load-sense circuit 420 can filter the feedback to capture and, in certain embodiments, amplify transients. Any number of passive or active filters can be used. Two potential embodiments are illustrated FIGS. 5 and 6.

Figure 5:
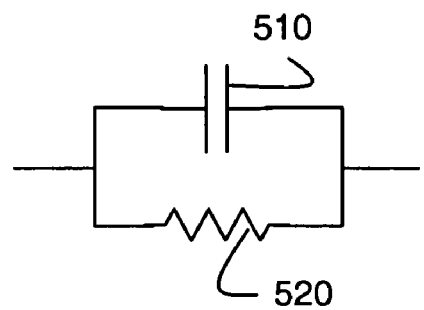
FIG. 5 illustrates one embodiment of a passive filter.
Figure 6:
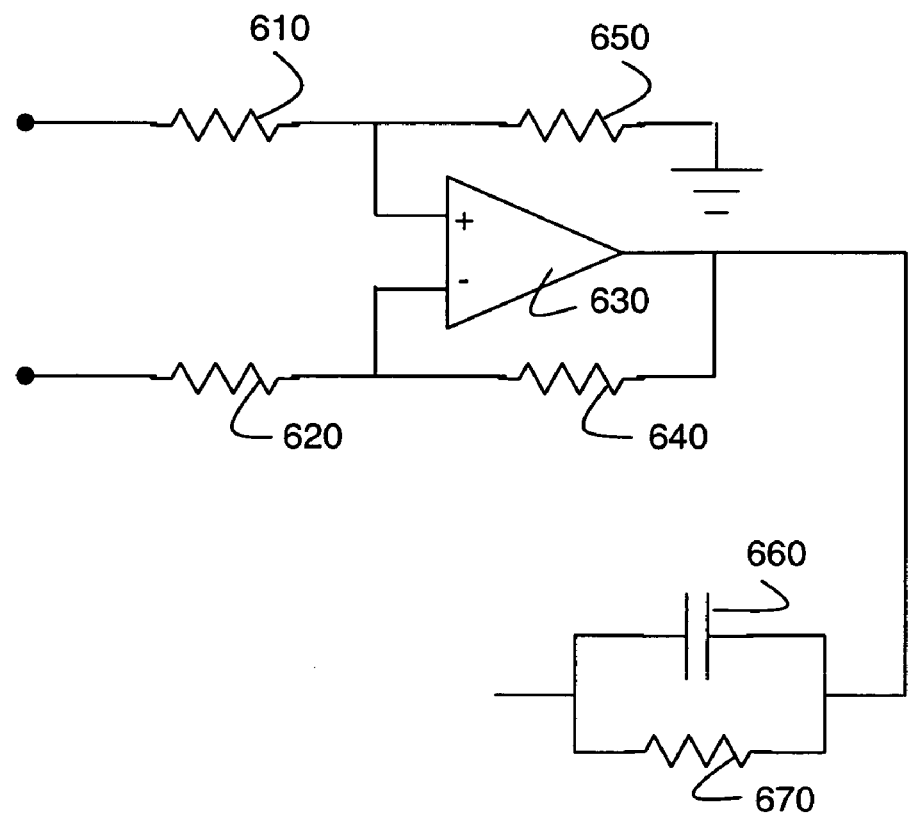
FIG. 6 illustrates one embodiment of an active filter.

FIG. 5 illustrates a passive filter. The filter comprises a capacitor 510 in parallel with a resistor 520. FIG. 6 illustrates an active filter for amplifying a voltage difference between differential signals. Specifically, the differential signals are supplied to two inputs of an operational amplifier 630 through respective resistors 610 and 620. One of the operational amplifier inputs is also tied to ground through a ground resistor 650. The other operational amplifier input is tied to the output of the operational amplifier through a feedback resistor 640. The operational amplifier output is then coupled to a passive transient filter. In the illustrated embodiment, the passive transient filter comprises a capacitor 660 in parallel with a resistor 670.

Returning to FIG. 4, regulator circuit 430 receives the two filtered inputs from input circuits 410 and 420, combines the filtered inputs, and adjusts the voltage level on output path 160 accordingly. Any number of regulator circuits can be used. One potential circuit is described below in FIGS. 7, 8, and 9.

Figure 7:
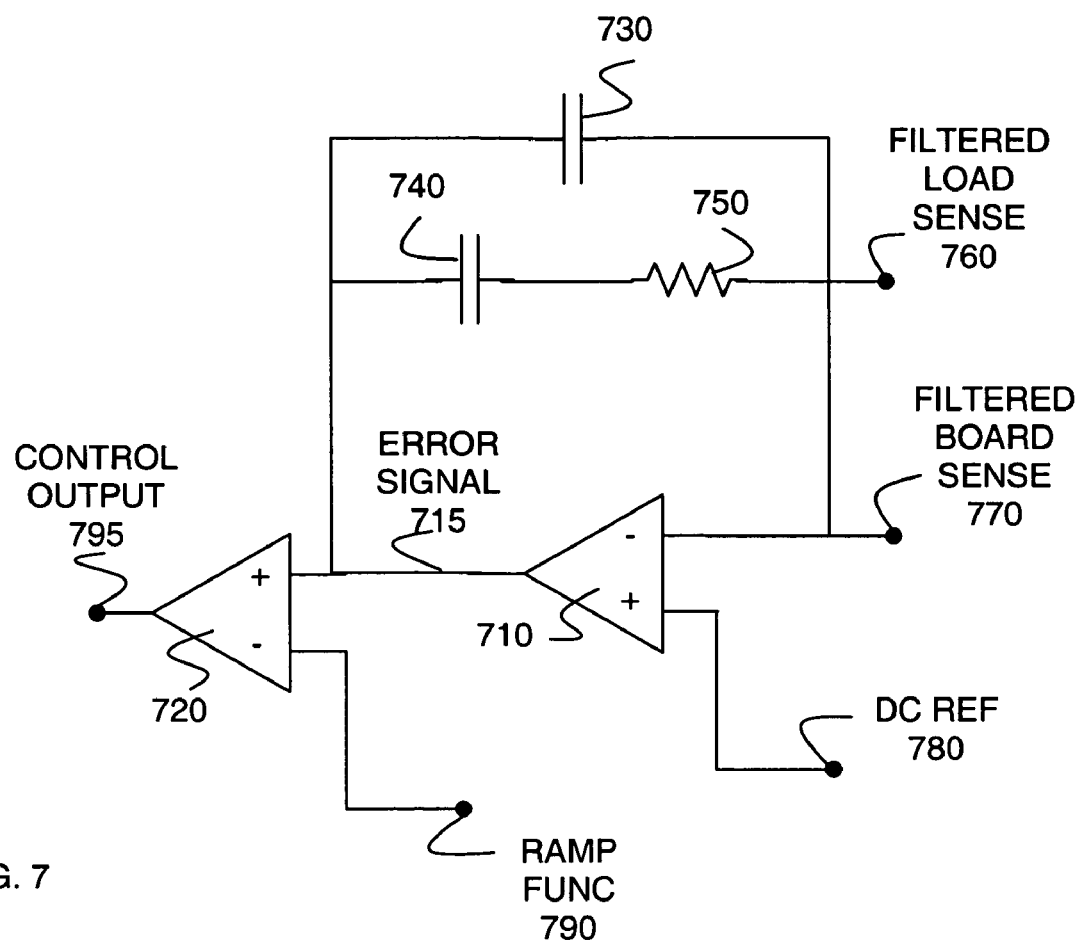
FIG. 7 illustrates one embodiment of an error amplifier and a pulse-width modulator.
Figure 8:
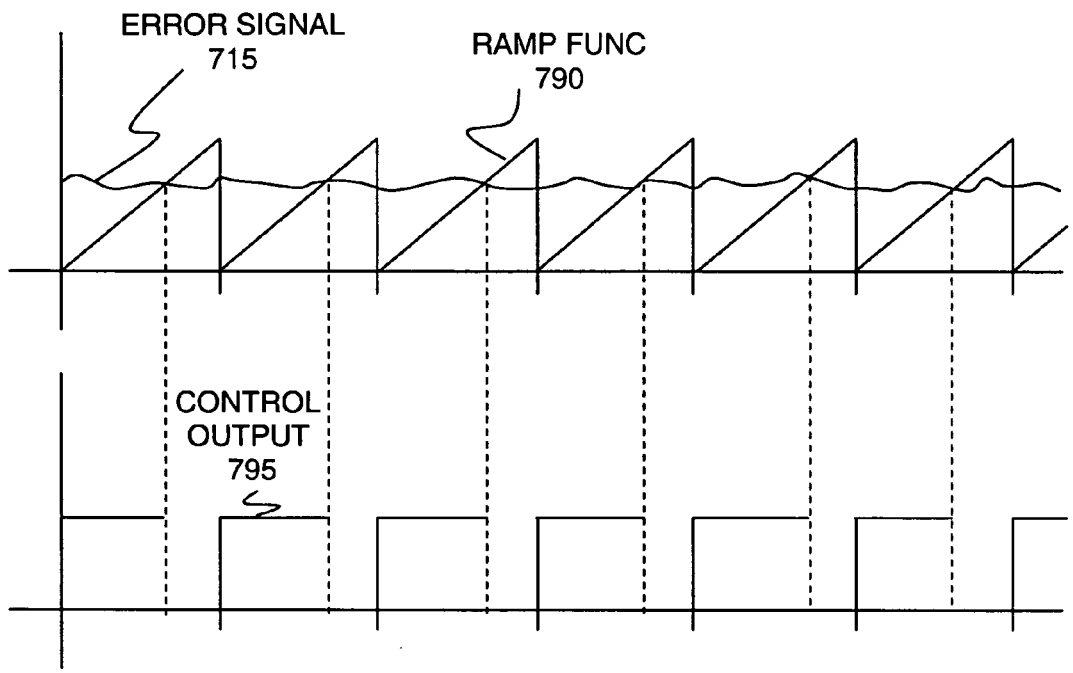
FIG. 8 illustrates one embodiment of signal functions from FIG. 7.

In FIG. 7, the filtered load sense signal 760 and the filtered board sense signal 770 are feed into one input of error amplifier 710. A DC reference signal 780 is supplied to the other input of amplifier 710. DC reference 780 is, or related to, a target voltage level for the combined input signal. Amplifier 710 compares the combined input signal to the DC reference and generates an error signal 715, which represents the difference between the DC reference and the input. The error signal is also fed back through a filter and combined with signals 760 and 770 at the amplifier input. The filter comprises a capacitor 740 in series with a resistor 750, both in parallel with a capacitor 730. FIG. 8 illustrates one embodiment of the error signal 715 from error amplifier 710.

An operational amplifier, such as error amplifier 710, may substantially attenuate fluctuations in an input signal. In order to achieve a quick response from the amplifier, a comparatively large change in the input signal may be needed. Transient voltage changes are particularly well suited for this because they tend to be large compared to steady-state changes. In other words, by combining the large, short-lived transient feedback with the longer-lasting, smaller steady-state feedback, it may be possible to achieve a faster response from the amplifier. Furthermore, if the passive transient response is not large enough to achieve the desired response time, an amplifier, such as the one illustrated in FIG. 6, can be used to increase the magnitude of the transient response and, therefore, increase the error signal response time.

Error signal 715 is supplied to comparator 720, which compares the error signal to a ramp function 790. One embodiment of ramp function 790 is illustrated in FIG. 8, overlaying error signal 715. Comparator 720 generates control output 795. As shown in FIG. 8, control output 795 is high when error signal 715 is above ramp function 790, and zero when error signal 715 is below ramp function 790.

Comparator 720 is basically a pulse-width modulator. As the difference between the combined input signals and the DC reference 780 increases, error signal 715 increases, moving higher up on the ramp slope of ramp function 790. As error signal 715 moves higher up the ramp slope, the pulses of control output 795 increase in length. In other words, the larger the error, the wider the pulses.

Figure 9:
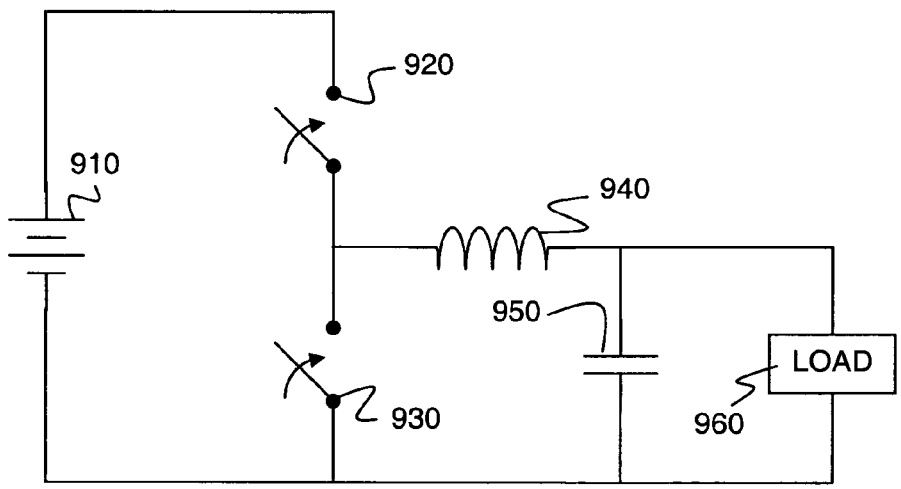
FIG. 9 illustrates one embodiment of a buck regulator system.

FIG. 9 illustrates one embodiment of a buck regulator circuit that can use the control output 795 to regulate the voltage supplied to a load 960. A voltage source 910 is coupled in series with two switches 920 and 930. Load 960 is coupled in parallel with a capacitor 950, both of which are coupled in series with an inductor 940. All three of which are connected in parallel with switch 930.

Switches 920 and 930 can be controlled by control output 795. For example, when control output 795 is high, switch 920 can close and switch 930 can open. In which case, current from voltage source 910 flows, building-up voltage across inductor 940, capacitor 950, and load 960. Then, when control output 795 is low, switch 920 can open and switch 930 can close. Current from source 910 stops, but current continues to flow to load 960 as inductor 940 discharges. As the switches rapidly open and close, the voltage level across load 960 remains relatively uniform. As the pulse widths increase and decrease however, the average voltage across load 960 increases or decreases.

Figure 10:
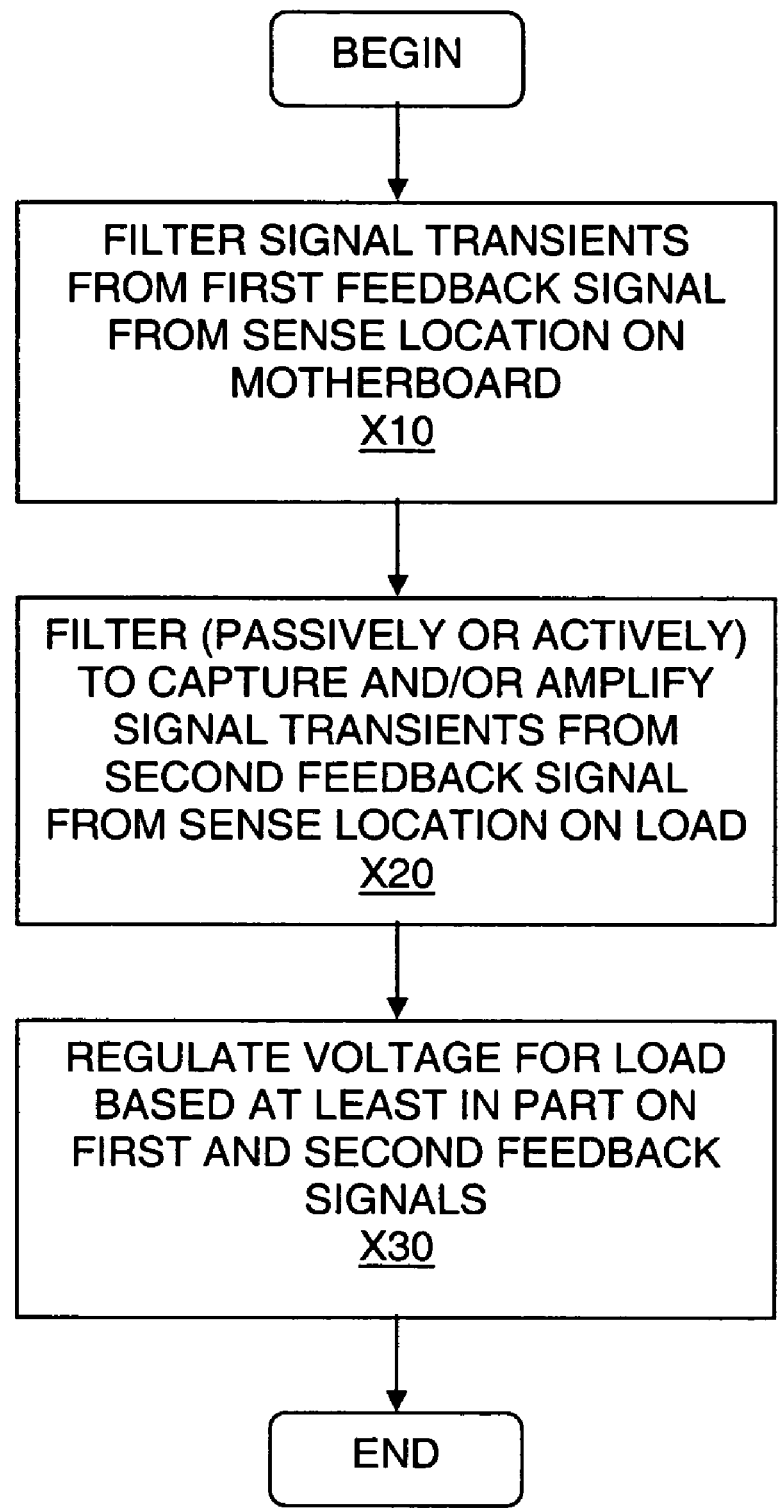
FIG. 10 illustrates a procedure for one embodiment of the present invention.

In general, embodiments of the present invention use multiple sense locations on an output path to regulate voltage. FIG. 10 demonstrates a procedure for one particular embodiment of the present invention. At 1010, the procedure filters signal transients out of a first feedback signal taken from a sense location on a motherboard. At 1020, the procedure actively or passively filters a second feedback signal taken from a sense location on a load to capture signal transients. Then, at 1030, the procedure regulates voltage for the load based at least in part on the first and second feedback signals.

FIGS. 1 through 10 illustrate a number of implementation specific details. Alternate embodiments may not include all of the illustrated elements, may include additional elements, may arrange the elements differently, and may combine or separate one or more of the elements. For example, voltage regulator 130 is shown as a single component in system 100, but, in alternate embodiments, the functions of voltage regulator 130 can be performed by any number of elements located in a variety of positions throughout the system. Similarly, alternate embodiments may not filter transients out of the board-level feedback. Furthermore, various functions of the present invention can be implemented in hardware, software, or a combination of hardware and software.

Thus, a multi-sense voltage regulator is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. An apparatus comprising:
   a voltage regulator having an output path to supply a voltage to power an electrical component, a power consumption rate of the electrical component to fluctuate during operation;
   a board-sense circuit to sense a first feedback signal at a first sense location on the output path, said board-sense circuit comprising a transient filter to capture steady-state feedback; and
   a load-sense circuit to sense a second feedback signal at a second sense location on the output path, said load-sense circuit comprising a steady state filter to capture transient feedback, said steady-state feedback and said transient feedback to at least partially represent fluctuations in the power consumption rate, and said voltage regulator to adjust the voltage based at least in part on a combination of the steady-state feedback and the transient feedback.

2. The apparatus of claim 1 further comprising:
   a motherboard to which the voltage regulator is coupled; and a socket to couple the electrical component to the motherboard.

3. The apparatus of claim 2 further comprising:
the electrical component;
wherein the first sense location is on the mother board; and
wherein the second sense location is on the electrical component.

4. The apparatus of claim 1 wherein the electrical component comprises a processor die.

5. The apparatus of claim 1 wherein the steady state filter comprises:
a passive filter.

6. The apparatus of claim 1 wherein the steady state filter comprises:
a capacitive element; and
a resistive element in parallel with the capacitive element.

7. The apparatus of claim 1 wherein the steady state filter comprises:
an active filter to amplify the transient feedback in the second feedback signal.

8. The apparatus of claim 1 wherein the steady state filter comprises:
an amplifier; and
a passive filter.

9. The apparatus of claim 8 wherein:
the second sense location comprises a differential pair; and
the amplifier comprises:
 a first resistive element coupled between a first line of the differential pair and a first node;
 a second resistive element coupled between a ground node and the first node;
 a third resistive element coupled between a second line of the differential pair and a second node;
 a differential amplifier having a first input coupled to the first node, a second input coupled to the second node, and an output coupled to a third node; and
 a fourth resistive element coupled between the second node and the third node, said third node coupled to the passive filter.

10. The apparatus of claim 1 wherein:
the second sense location comprises a differential pair; and
the second sense location comprises differential sense points across the electrical component.

11. The apparatus of claim 10 wherein the second sense location comprises:
a first sense pin for a source voltage at the electrical component; and
a second sense pin for a source ground at the electrical component.

12. The apparatus of claim 1 wherein the second sense location comprises a sense pin on the electrical component.

13. An apparatus comprising:
a first input circuit to provide a steady-state feedback from a first sense location in an output path, said first sense location being on a motherboard;
a second input circuit to provide a transient response feedback from a second sense location in the output path, said second sense location being on an electrical component that is electrically coupled to the motherboard; and
a voltage regulator to regulate a voltage on the output path to power the electrical component based at least in part on a combination of the steady-state feedback and the transient response feedback, said steady-state feedback and said transient response feedback to at least partially represent fluctuations in a power consumption rate of the electrical component during operation.

14. The apparatus of claim 13 wherein the second input circuit comprises a passive, high-pass filter.

15. The apparatus of claim 13 wherein the second input circuit comprises a capacitor in parallel with a resistor.

16. The apparatus of claim 13 wherein the second input circuit comprises an active, high-pass filter.

17. The apparatus of claim 13 wherein the second sense location comprises a differential pair of sense points on the electrical component, and wherein the second input circuit comprises:
a differential amplifier having two inputs to couple with the differential pair of sense points.

18. The apparatus of claim 17 wherein the second input circuit further comprises:
a first input resistor to couple in series with a first one of the differential pair of sense points and a first input of the two inputs of the differential amplifier;
a second input resistor to couple in series with a second one of the differential pair of sense points and a second input of the two inputs of the differential amplifier;
a ground resistor to couple a ground to the first input of the differential amplifier; and
a feedback resistor to couple an output of the differential amplifier to the second input of the differential amplifier.

19. The apparatus of claim 18 wherein the second input circuit further comprises:
a passive, high-frequency filter coupled to the output of the differential amplifier.

20. The apparatus of claim 18 wherein the second input circuit further comprises:
a capacitor and a resistor coupled in parallel, said capacitor and said resistor coupled in series to the output of the differential amplifier.

21. The apparatus of claim 13 wherein the voltage regulator comprises:
an error amplifier;
a pulse-width modulator; and
a buck regulator.

22. A method comprises:
sensing a first feedback signal at a first sense location on an output path;
filtering transient components from the first feedback signal to capture steady-state feedback;
sensing a second feedback signal at a second sense location on the output path;
filtering a steady-state component from the second feedback signal to capture transient feedback; and
regulating a voltage to power an electrical component on the output path based at least in part on a combination of the steady-state feedback and the transient feedback, said steady-state feedback and said transient feedback to at least partially represent fluctuations in a power consumption rate of the electrical component during operation.

23. The method of claim 22 wherein the first sense location is on a motherboard and the second sense location is on the electrical component, said electrical component being coupled to the motherboard by a socket.

24. The method of claim 22 wherein filtering the transient components comprises:
passively filtering the second feedback signal to capture the transient feedback.

25. The method of claim 22 wherein filtering the transient components comprises:
actively filtering the second feedback signal to amplify the transient feedback.

26. A system comprising:
a motherboard;
a processor coupled to the motherboard; and
a voltage regulation circuit to provide a voltage signal to power the processor, said voltage regulation circuit comprising
a first input circuit to provide a steady-state feedback from a first sense location in a voltage path for the voltage signal, said first sense location being on the motherboard;
a second input circuit to provide a transient response feedback from a second sense location in the voltage path, said second sense location being on the processor; and
a voltage regulator to regulate the voltage signal based at least in part on a combination of the steady-state feedback and the transient response feedback, said steady-state feedback and said transient response feedback to at least partially represent fluctuations in a power consumption rate of the processor during operation.

27. The system of claim 26 wherein the second input circuit comprises a passive, high-pass filter.

28. The system of claim 26 wherein the second input circuit comprises a capacitor in parallel with a resistor.

29. The system of claim 26 wherein the second input circuit comprises an active, high-pass filter.

30. The system of claim 26 wherein the second sense location comprises a differential pair of sense points on the processor, and wherein the second input circuit comprises:
a differential amplifier having two inputs to couple with the differential pair of sense points.

* * * * *